(12) United States Patent
Jiang

(10) Patent No.: US 8,993,426 B2
(45) Date of Patent: Mar. 31, 2015

(54) SEMICONDUCTOR DEVICE WITH JUNCTION TERMINATION EXTENSION STRUCTURE ON MESA AND METHOD OF FABRICATING THE SAME

(71) Applicant: Chii-Wen Jiang, Hsinchu (TW)

(72) Inventor: Chii-Wen Jiang, Hsinchu (TW)

( * ) Notice: Subject to any disclaimer, the term of this patent is extended or adjusted under 35 U.S.C. 154(b) by 0 days.

(21) Appl. No.: 13/739,615

(22) Filed: Jan. 11, 2013

(65) Prior Publication Data

US 2014/0145292 A1 May 29, 2014

(30) Foreign Application Priority Data

Nov. 26, 2012 (TW) .............................. 101144183 A

(51) Int. Cl.
  *H01L 21/425* (2006.01)
  *H01L 21/265* (2006.01)
  *H01L 29/06* (2006.01)
(52) U.S. Cl.
  CPC .......... *H01L 21/265* (2013.01); *H01L 29/0661* (2013.01)

USPC .... 438/530; 438/704; 257/496; 257/E21.135; 257/E29.257

(58) Field of Classification Search
None
See application file for complete search history.

(56) References Cited

U.S. PATENT DOCUMENTS

| 7,071,537 B2* | 7/2006 | Kelberlau et al. ............. 257/603 |
| 2009/0267141 A1* | 10/2009 | Matocha et al. .............. 257/329 |
| 2013/0099251 A1* | 4/2013 | Hiyoshi et al. ................. 257/77 |

* cited by examiner

*Primary Examiner* — Sonya D McCall Shepard
(74) *Attorney, Agent, or Firm* — IPR Works, LLC

(57) ABSTRACT

The invention provides a semiconductor device with a junction termination extension structure on a mesa and a method of fabricating the same. The device comprises: a type-I semiconductor substrate having a first surface and a second surface; a type-I epitaxial layer disposed on the first surface; at least one depression disposed on the type-I epitaxial layer; a mesa-type junction termination extension structure surrounding the at least one depression wherein the mesa-type junction termination extension structure is of type-II; and at least one semiconductor component formed one the depression.

11 Claims, 15 Drawing Sheets

SEMICONDUCTOR DEVICE WITH JUNCTION TERMINATION EXTENSION STRUCTURE ON MESA AND METHOD OF FABRICATING THE SAME

BACKGROUND OF THE INVENTION (a) Field of the Invention

The invention relates to a semiconductor device and method for fabricating the same, particularly to a semiconductor device with junction termination extension structure on mesa and method of fabricating the same.

(b) Description of the Related Art

In general, a semiconductor device, especially a power device, is provided with various junction termination extension regions or structures at its periphery to prevent voltage breakdown at the edge of the active region of the semiconductor device. For example, FIG. 15 shows a schematic diagram of a planar junction including a floating ring structure where the upper portion shows a top-view diagram and the lower portion shows a cross-sectional diagram according to prior art. The semiconductor device 100 comprises a type-I substrate 1, a type-I epitaxial layer 2, an oxide layer 3, a type-II doping region 4, an anode 6a and a cathode 6b. In the above, "type-I" indicates n-type or p-type semiconductor or doping and "type-II" indicates semiconductor or doping different from "type I". That is, when type-I indicates n-type, "type-II" indicates p-type and vice versa. In order to control and maintain high breakdown voltages, usually, for example, a slanted surface at the edge of a wafer is formed or a method of mesa etching is used. Furthermore, recently, ion implantation is used to dispose a lightly doped zone at edges of junctions to achieve high breakdown voltages and low leakage currents. In order to reduce the production cost of these junction termination extension regions or structures, they are fabricated at the same time when main junctions of the semiconductor device are fabricated.

On the other hand, for a semiconductor device, especially a power device, it is expected to have a low forward bias during operation and low current crowding effect so as to lower power consumption and increase efficiency while applied in electronic device but these properties of a planar junction type semiconductor device cannot be improved, especially for a high voltage silicon semiconductor device. Therefore, more complicated or sophisticated design is required to be added in the semiconductor device or a novel semiconductor device is needed.

BRIEF SUMMARY OF THE INVENTION

In light of the above-mentioned problem, one object of the invention is to provide a semiconductor device with junction termination extension structure on mesa and method of fabricating the same so as to reduce the length of a drift region, lower the resistance of the drift region, and increase current spreading effect (reduce current crowding effect). Furthermore, by having a semiconductor device comprise mesa-type junction termination extension structure(s), the semiconductor device can have high breakdown voltages in its active region, low leakage current and the reliability of the device can be increased. For example, electrostatic discharge resistance and high temperature application capability can be increased. Forward operating voltages can be reduced by shortening the length of the drift region and increasing current spreading effect.

In order to achieve the above purposes, according to one embodiment of the invention, a semiconductor device with a junction termination extension structure on a mesa is provided. The semiconductor device comprises a type-I semiconductor substrate, a type-I epitaxial layer, at least one depression, a mesa-type junction termination extension structure, and at least one semiconductor component. The type-I semiconductor substrate has a first surface and a second surface. The type-I epitaxial layer is disposed on the first surface. The at least one depression functions as an active region of the semiconductor device and is disposed on the type-I epitaxial layer. The depression has a side surface and a bottom surface. The mesa-type junction termination extension structure, surrounds the at least one depression and the mesa-type junction termination extension structure has a planar junction depth ($X_{jp}$) and a cylindrical junction radius ($R_j$) where the cylindrical junction radius ($R_j$) is varied with change of $X_{jp}$ and the mesa-type junction termination extension structure is of type-II doping. The at least one semiconductor component is formed in the depression. A distance between the bottom surface of the depression and the mesa of the mesa-type junction termination extension structure is defined as a depth of the depression. "Type-I" is defined as either n-type doping or p-type semiconductor or doping while "type-II" is then defined as one type of doping different from "type-I". That is, when type-I indicates n-type, "type-II" indicates p-type and vice versa.

In one embodiment, the semiconductor device further comprises one or a plurality of guard ring regions, disposed in the type-I epitaxial layer and being type-II doping.

In one embodiment, the side surface is slanted at an angle about 90~150° with respect to the bottom surface. Or, in another embodiment, the side surface is an arc surface In one embodiment, a type-I or type-II doping region is disposed in the type-I epitaxial layer underneath the bottom surface.

In one embodiment, the depression has a depth ($X_{np}$) is less than or equal to the planar junction depth ($X_{jp}$).

In one embodiment, the semiconductor component is selected from the group consisting of the following or combination thereof: Schottky diode, fast recovery epitaxial diode (FRED), metal oxide semiconductor (MOS), transistor, thin-film transistor, MOS field emission transistor, and insulated gate bipolar transistor (IBGT).

In one embodiment, the mesa-type junction termination extension structure comprises a plurality of type-II doping regions and the type-II doping regions have different doping concentration.

According to another embodiment of the invention, a method of fabricating a semiconductor device with a junction termination extension structure on a mesa is provided. The method comprises: providing a type-I semiconductor substrate having a first surface and a second surface; forming a type-I epitaxial layer on the first surface; forming a junction termination extension structure in at least one region of the type-I epitaxial layer wherein the junction termination extension structure is of type-II doping; etching a central portion of the junction termination extension structure to form a depression functioning as an active region of the semiconductor device wherein the depression has a side surface and a bottom surface and, at the same time, to form a mesa-type junction termination extension structure at an outer portion of the junction termination extension structure surrounding the active region; and forming at least one semiconductor component in the active region of the semiconductor device; wherein "type-I" is defined as either n-type or p-type semiconductor or doping and "type-II" is then defined as one type of semiconductor or doping different from "type-I".

In one embodiment, the method further comprises: forming a guard ring region or guard ring regions in the type-I epitaxial layer at the same time when the step of forming a junction termination extension structure in at least one region of the type-I epitaxial layer is performed.

In one embodiment, the method further comprises: forming a type-I or type-II doping region underneath the bottom surface of the depression after the step of etching the central portion of the junction termination extension structure to form the depression and the mesa-type junction termination extension structure.

In one embodiment, the step of forming a junction termination extension structure in at least one region of the type-I epitaxial layer comprises: forming a first junction termination extension structure in at least one region of the type-I epitaxial layer by using a first photo-mask and utilizing ion implantation and thermal diffusion methods; and forming a second junction termination extension structure in one portion of the first junction termination extension structure by using a second photo-mask and utilizing ion implantation and thermal diffusion methods.

In one embodiment, the step of forming a junction termination extension structure in at least one region of the type-I epitaxial layer further comprises: forming a third junction termination extension structure in one portion of the second junction termination extension structure by using a third photo-mask and utilizing ion implantation and thermal diffusion methods after the second junction termination extension structure is formed.

In one embodiment, the method further comprises: forming a fourth junction termination extension structure in one portion of the second junction termination extension structure by using a fourth photo-mask and utilizing ion implantation and thermal diffusion methods, after the step of etching the central portion of the junction termination extension structure to form the depression and the mesa-type junction termination extension structure.

In one embodiment, the method further comprises: forming a fifth junction termination extension structure in one portion of the fourth junction termination extension structure by using a fifth photo-mask and utilizing ion implantation and thermal diffusion methods, after the step of forming a fourth junction termination extension structure.

In one embodiment, the first, second, and third junction termination extension structures separately are of type-II doping regions having different doping concentration.

In one embodiment, the mesa-type junction termination extension structure has a depth, in a thickness direction of the semiconductor device, being larger than or equal to a mesa height that is a distance between the bottom surface of the depression and the mesa of the mesa-type junction termination extension structure.

In one embodiment, a dry etching or wet etching method is used to have the side surface slanted at an angle of 90~150° with respect to the bottom surface.

In one embodiment, alternately performing dry etching and wet etching is used to have the side surface be an arc surface.

In one embodiment, the semiconductor component is selected from the group consisting of the following or combination thereof: Schottky diode, fast recovery epitaxial diode (FRED), metal oxide semiconductor (MOS), transistor, thin-film transistor, MOS field emission transistor, and insulated gate bipolar transistor (IBGT).

According to the semiconductor device with a junction termination extension structure on a mesa and the method for fabricating the same of the present invention, high breakdown voltages, low leakage current and reduced current crowding effect can be achieved.

Other objects and advantages of the invention can be better understood from the technical characteristics disclosed by the invention. In order to clarify the above mentioned and other objects and advantages of the invention, examples accompanying with figures are provided and described in details in the following.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Accordingly, the drawings and descriptions will be regarded as illustrative in nature and not as restrictive. In figures, elements of the same function are represented by the same symbol. FIGS. 1~14 are cross-sectional schematic diagrams represented the same way as FIG. 15 where it is a cross-sectional schematic diagram along AA line. In the following, "Type-I" is defined as either n-type doping or p-type semiconductor or doping while "type-II" is then defined as one type of doping different from "type-I". That is, when type-I indicates n-type, "type-II" indicates p-type and vice versa.

According to the first embodiment of the invention, the semiconductor device has the following characteristics: comprising: a type-I semiconductor substrate, a type-I epitaxial layer, at least one depression, a mesa-type junction termination extension structure, and at least one semiconductor component. The type-I semiconductor substrate has a first surface and a second surface. The type-I epitaxial layer is disposed on the first surface. The at least one depression functions as an active region of the semiconductor device and is disposed on the type-I epitaxial layer. The depression has a side surface and a bottom surface. The mesa-type junction termination extension structure, surrounds the at least one depression and the mesa-type junction termination extension structure has a planar junction depth (Xjp) and a cylindrical junction radius (Rj) where the cylindrical junction radius (Rj) is varied with change of Xjp and the mesa-type junction termination extension structure is of type-II doping. The at least one semiconductor component is formed in the depression.

Figure 1:
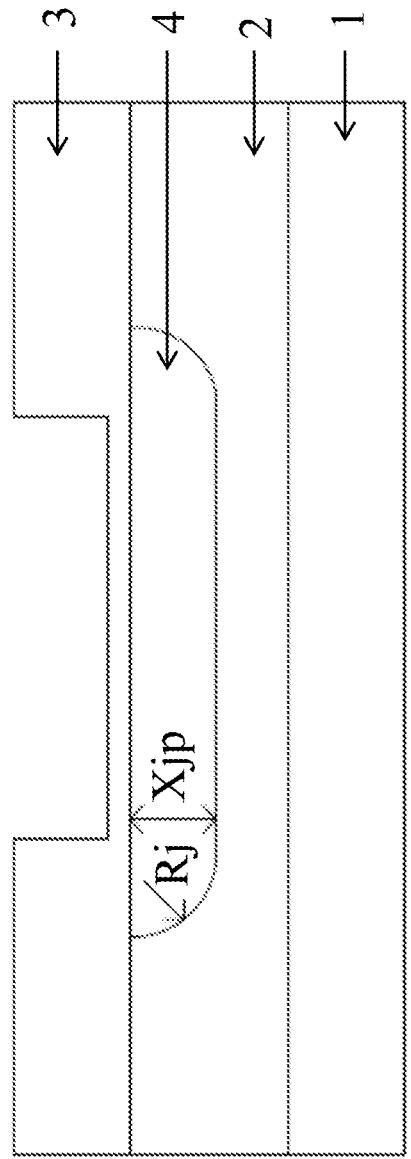
FIG. 1 shows a cross-sectional schematic diagram illustrating a state of the semiconductor device during fabrication processing according to the first embodiment of the invention.

FIG. 1 shows a cross-sectional schematic diagram illustrating a state of the semiconductor device during fabrication processing according to the first embodiment of the invention. The semiconductor device 101 comprises a type-I semiconductor substrate 1, a type-I epitaxial layer 2, oxide layer 3 (for example, $SiO_2$) and a type-II doping region 4. Specifically, the type-I semiconductor substrate 1 is of n+ type ("+" indicates heavily doped, i.e. high doping concentration), the type-I epitaxial layer 2 is of n type (lightly doped, i.e. low concentration; n<n+), the oxide layer 3 is silicon oxide and the type-II doping region 4 is p-well. During fabricating p-well 4, oxide with a proper thickness is formed on the surface. The type-II doping region 4 (p-well 4) has a planar junction depth (Xjp) and a cylindrical junction radius (Rj). The cylindrical junction radius (Rj) is varied with change of Xjp. Since the breakdown voltage is determined by the cylindrical junction radius (Rj), the value of the breakdown voltage can be adjusted by changing the cylindrical junction radius (Rj) or planar junction depth (Xjp). Besides, the planar junction depth (Xjp) has to be large enough to obtain the relation of Xjp and Rj to be Ri≈0.8Xjp~0.9Xjp so as to let the type-II doping region 4 have the efficacy of reducing edge effect. In the subsequent processes, in the type-II doping region 4, a depression and a mesa-type junction termination extension structure will be formed.

Figure 2:
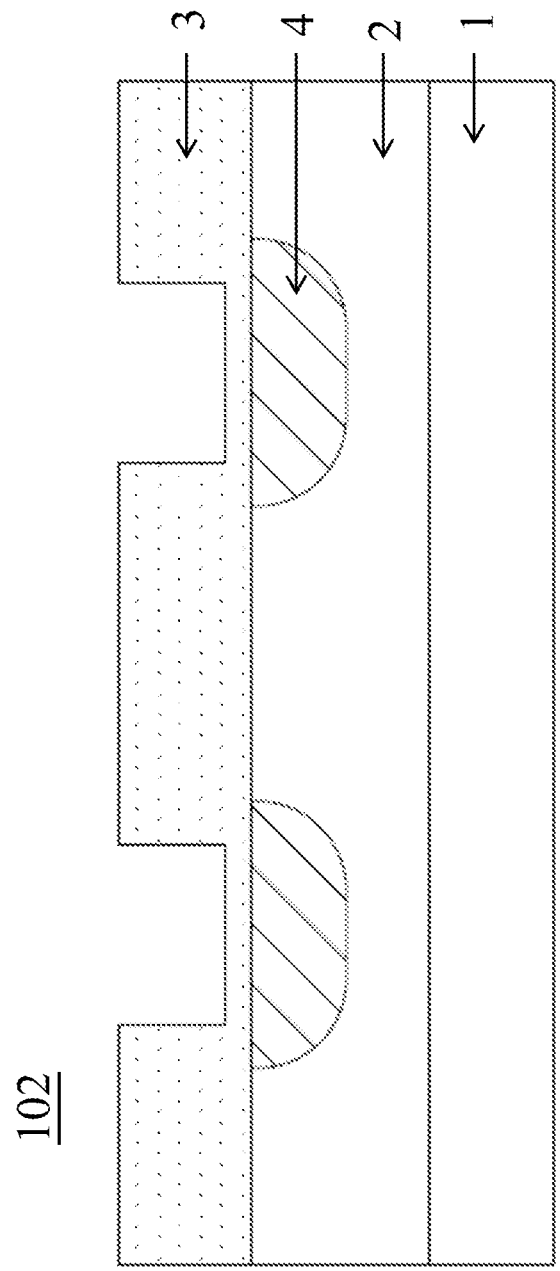
FIG. 2 shows a cross-sectional schematic diagram illustrating a state of the semiconductor device during fabrication processing according to the second embodiment of the invention.

FIG. 2 shows a cross-sectional schematic diagram illustrating a state of the semiconductor device during fabrication processing according to the second embodiment of the invention. The difference between the semiconductor device 102 shown in FIG. 2 and the semiconductor device 101 shown in FIG. 1 is that a plurality of type-II doping regions 4 are formed where there are two type-II doping regions in FIG. 2. Similarly, in the subsequent processes, in the type-II doping regions 4, depressions and mesa-type junction termination extension structures will be formed.

Figure 3:
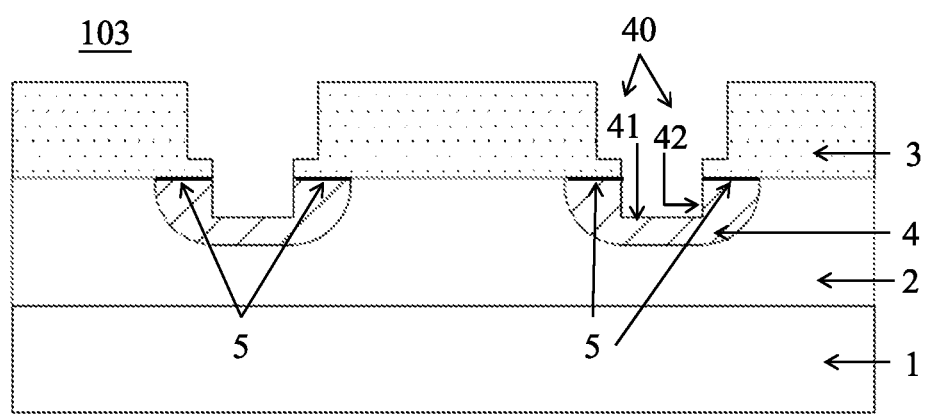
FIG. 3 shows a cross-sectional schematic diagram illustrating a state of the semiconductor device during fabrication processing according to the third embodiment of the invention.
Figure 4:
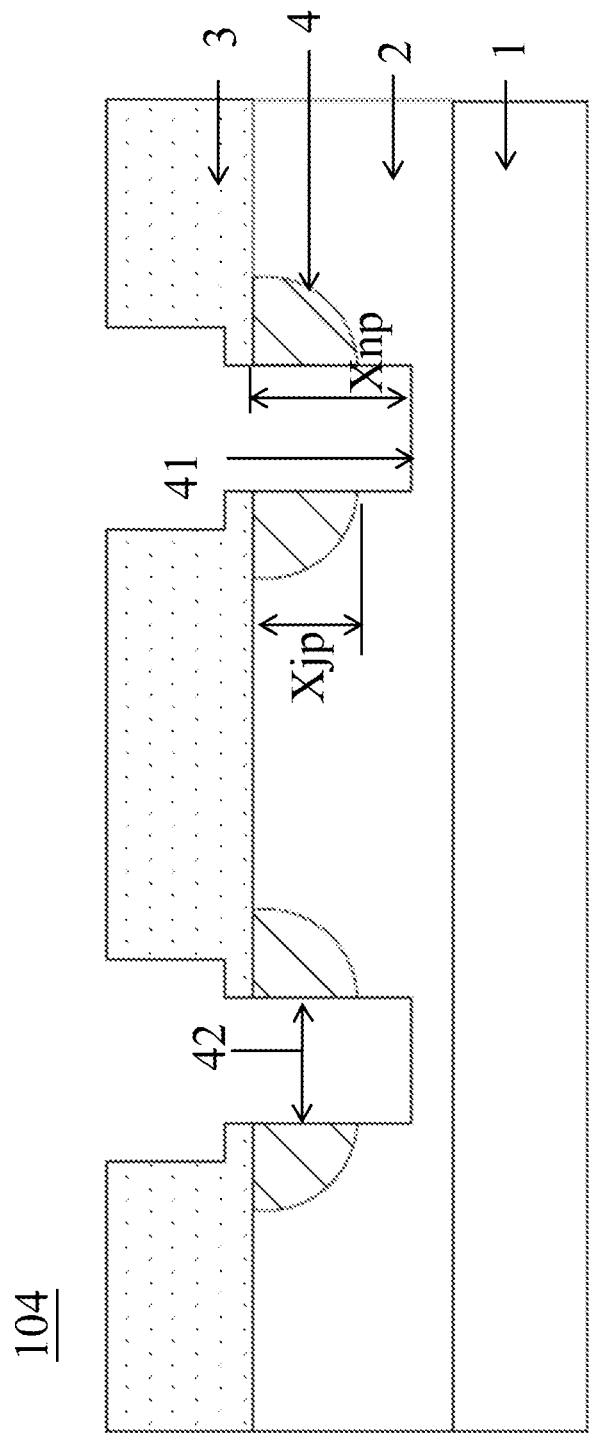
FIG. 4 shows a cross-sectional schematic diagram illustrating a state of the semiconductor device during fabrication processing according to the fourth embodiment of the invention.

Please simultaneously refer to FIGS. 3 and 4. FIG. 3 shows a cross-sectional schematic diagram illustrating a state of the semiconductor device during fabrication processing according to the third embodiment of the invention while FIG. 4 shows a cross-sectional schematic diagram illustrating a state of the semiconductor device during fabrication processing according to the fourth embodiment of the invention. By etching the semiconductor device 102 shown in FIG. 2, the semiconductor device 103 or 104 can be formed where the etching depth is based on the design of the processes of the semiconductor device and a plurality of depressions 40 (two in the figure but can be more than two) are formed. The depression 40 has a bottom surface 41 and a side surface 42. In FIG. 3, symbol 5 represents the mesa of the mesa-type junction termination extension structure. Xnp represents the depth of the depression and the magnitude of Xnp is determined according to the design of the semiconductor device. By removing this portion (neutral region or drift region), parasitic resistance can be reduced so as to lower the forward bias required to drive the device and reduce power consumption without affecting reversed breakdown voltages. The depth of the mesa-type junction termination extension structure (type-II doping regions 4), in the thickness direction of the semiconductor device, is larger than or equal to a mesa height that is a distance between the bottom surface of the depression and the mesa 5 of the mesa-type junction termination extension structure. Furthermore, the planar junction depth (Xjp) and the depth of the depression (Xnp) preferably has the following relation: $0.5Xjp<Xnp<0.95Xjp$.

Figure 5:
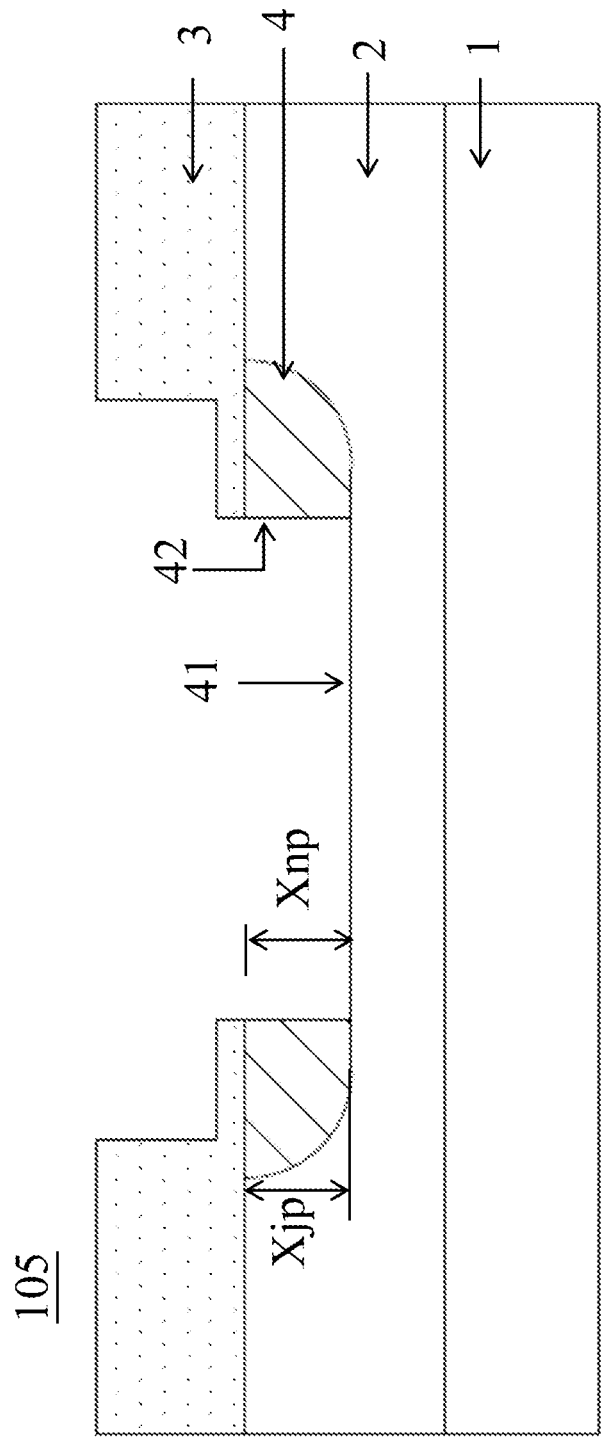
FIG. 5 shows a cross-sectional schematic diagram illustrating a state of the semiconductor device during fabrication processing according to the fifth embodiment of the invention.
Figure 6:
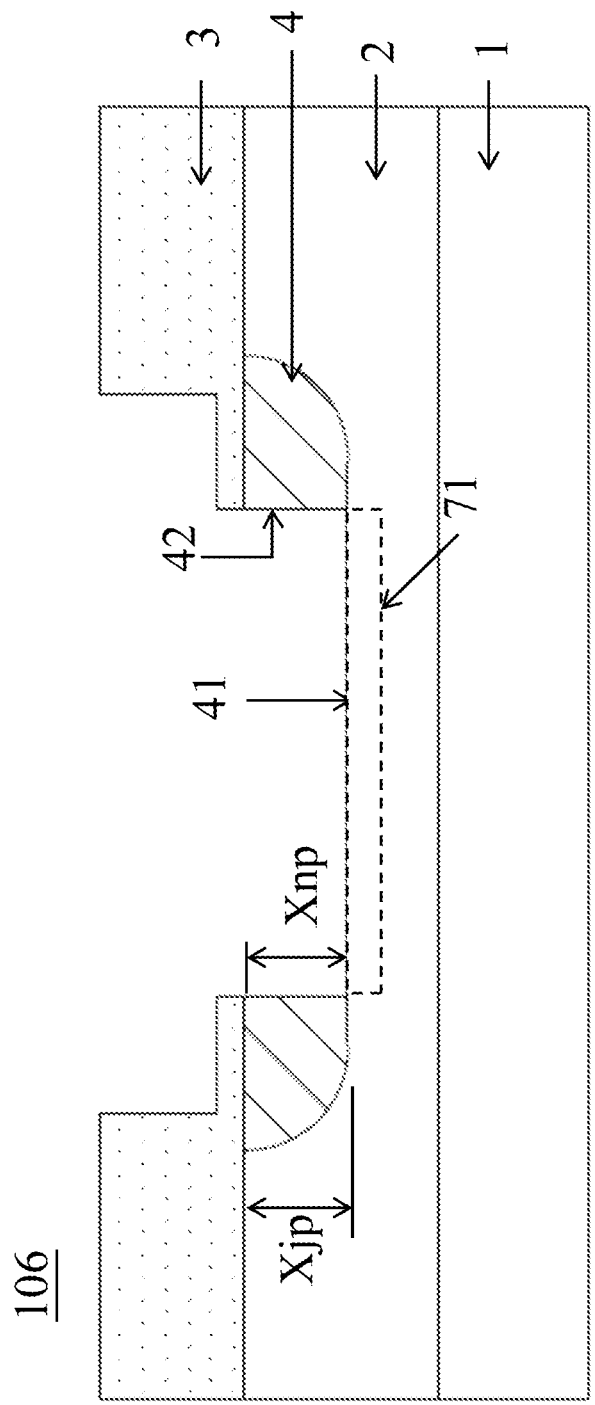
FIG. 6 shows a cross-sectional schematic diagram illustrating a state of the semiconductor device during fabrication processing according to the sixth embodiment of the invention.
Figure 7:
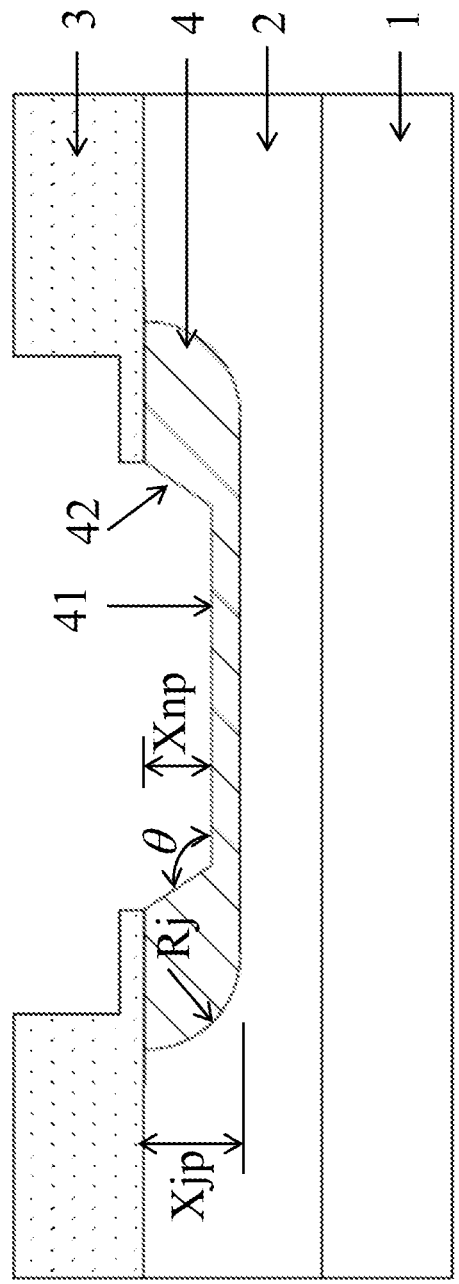
FIG. 7 shows a cross-sectional schematic diagram illustrating a state of the semiconductor device during fabrication processing according to the seventh embodiment of the invention.

Please simultaneously refer to FIGS. 5~7. FIGS. 5~7 show cross-sectional schematic diagrams separately illustrating a state of the semiconductor device during fabrication processing according to the fifth~seventh embodiment of the invention. Similarly, by etching the semiconductor device 101 shown in FIG. 1, the semiconductor device 105, 106 or 107 shown in FIG. 5, 6 or 7 can be formed where a depression 40 is formed and has a bottom surface 41 and a side surface 42. In FIG. 5, the depth of the depression (Xnp) is substantially equal to the planar junction depth (Xjp). Besides, in FIG. 6, within the bottom surface 41, that is, on the surface of the active region and underneath the active region, a doping region 71 can be formed by changing the doping type or change the doping concentration, before fabricating the semiconductor component. Certainly, a doping region 71 can also be implemented in the embodiment of FIG. 7 (not shown in FIG. 7), that is, under the condition of Xnp<Xjp. In the embodiment of FIG. 7, an angle θ between the side surface 42 and the bottom surface 41 can be larger than 90° or can be for example 90~150°. For the angle θ being 90~150°, a dry etching or wet etching process can be used to obtain the angle θ. In another embodiment, by alternately performing dry etching and wet etching, the side surface 42 can be an arc surface but the invention is not limited to the above examples.

That is, the side surface 42 can be a slanted surface, a perpendicular surface or an arc surface.

Figure 8:
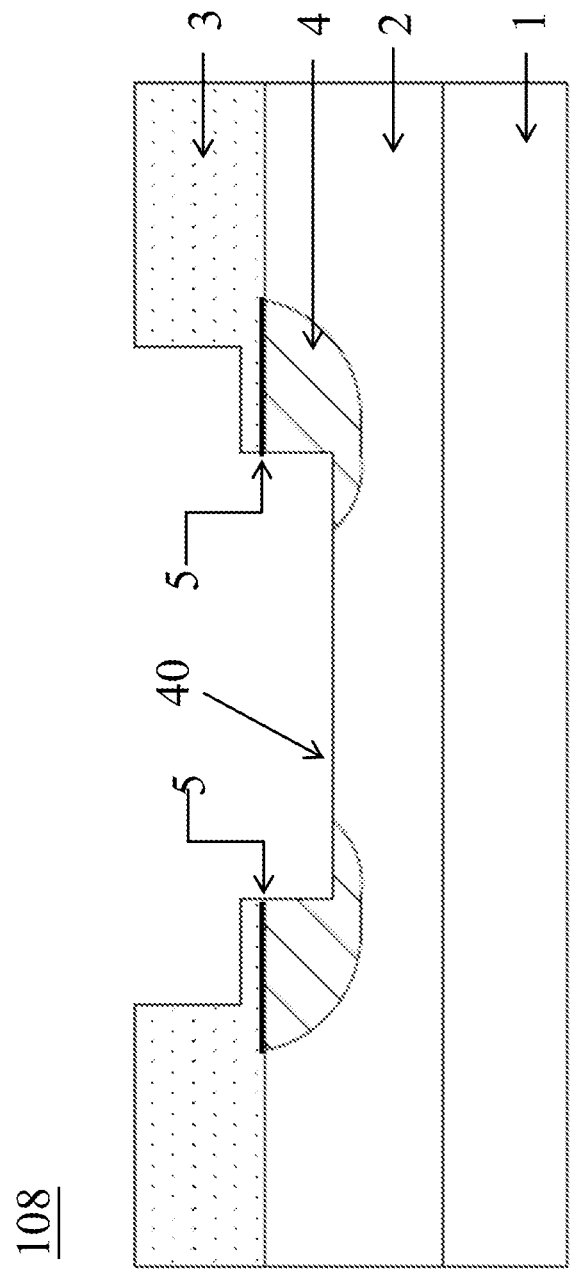
FIG. 8 shows a cross-sectional schematic diagram illustrating a state of the semiconductor device during fabrication processing according to the eighth embodiment of the invention.

Furthermore, FIG. 8 shows a cross-sectional schematic diagram illustrating a state of the semiconductor device during fabrication processing according to the eighth embodiment of the invention. The semiconductor device 108 in FIG. 8 can be formed by etching the semiconductor device 102 of FIG. 2 based on the design of photo-mask of the semiconductor device to form a depression 40. In FIG. 8, symbol 5 represents the mesa of the mesa-type junction termination extension structure.

In addition, the semiconductor devices shown in FIGS. 1~8 can further comprise one or a plurality of guard ring regions (not shown in figures, it can be disposed for example at the similar position of the floating ring shown in FIG. 15) disposed in the type-I epitaxial layer where the guard ring region is of type-II.

The following describes the semiconductor component disposed on the depression 40.

Figure 9:
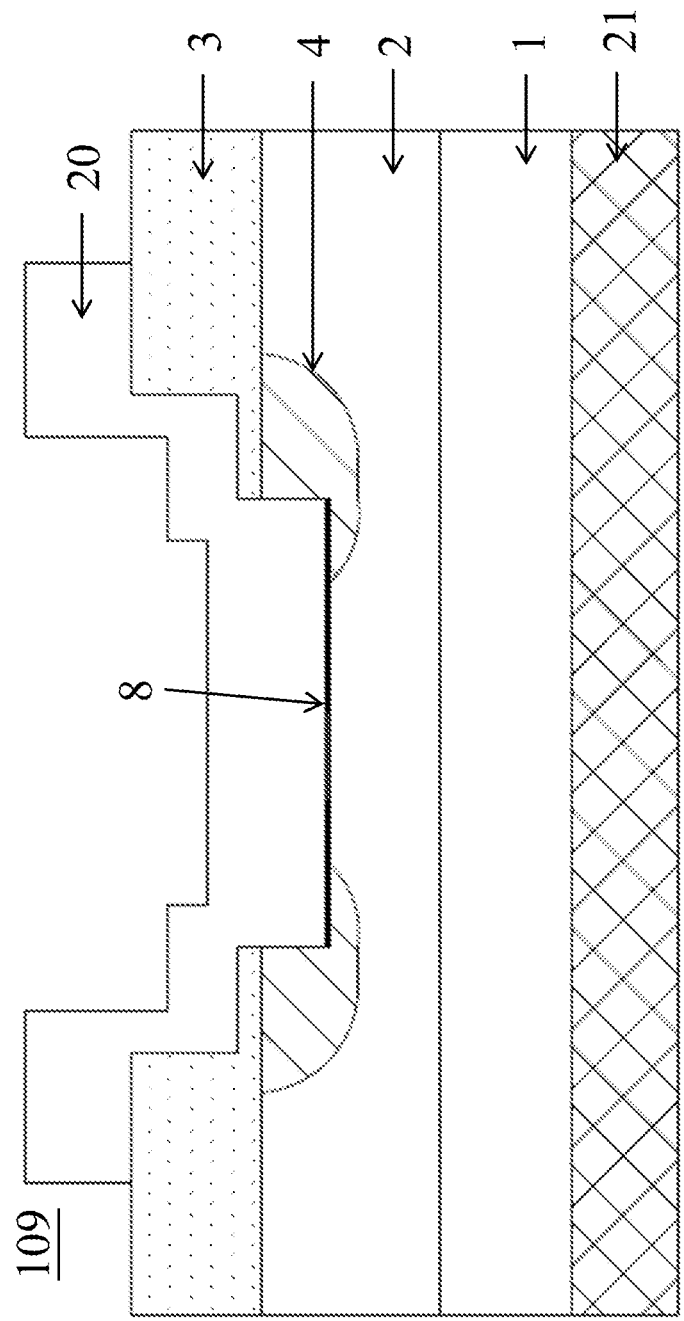
FIG. 9 shows a cross-sectional schematic diagram illustrating part of a Schottky diode according to the ninth embodiment of the invention.
Figure 10:
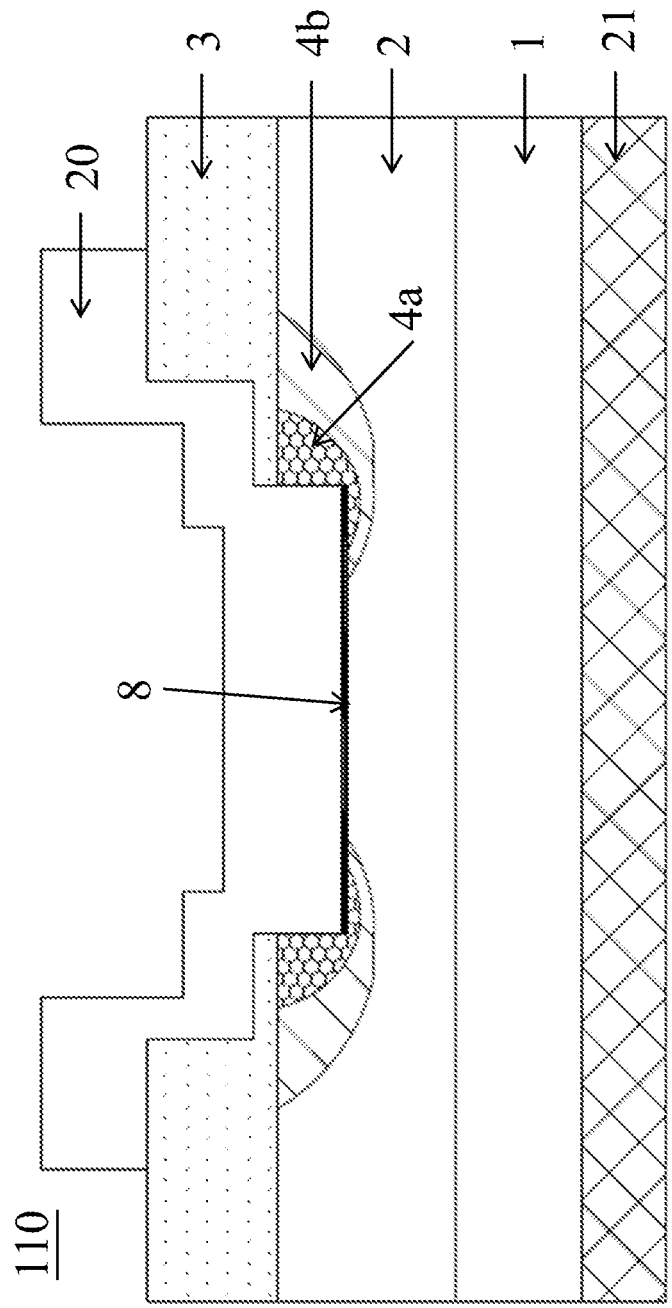
FIG. 10 shows a cross-sectional schematic diagram illustrating part of a Schottky diode according to the tenth embodiment of the invention.

FIG. 9 shows a cross-sectional schematic diagram illustrating part of a Schottky diode according to the ninth embodiment of the invention where symbol 8 represents the Schottky barrier, symbol 20 represents the frontside metal layer, symbol 21 represents the backside metal layer. The Schottky diode 109 (or semiconductor device 109) can be formed from the semiconductor device 108 of FIG. 8. Furthermore, in another embodiment, FIG. 10 shows a cross-sectional schematic diagram illustrating part of a Schottky diode 110 (semiconductor device 110) according to the tenth embodiment of the invention. The difference between the Schottky diode 110 (or semiconductor device 110) and the Schottky diode 109 (semiconductor device 109) is that the type-II doping region 4 comprises p+ region 4a and p− region 4b. The difference between the p+ region 4a and the p− region 4b is the doping concentration of type-II. For example, at first the low concentration p− region 4b is formed and then the high concentration p+ region 4a is formed.

Figure 11:
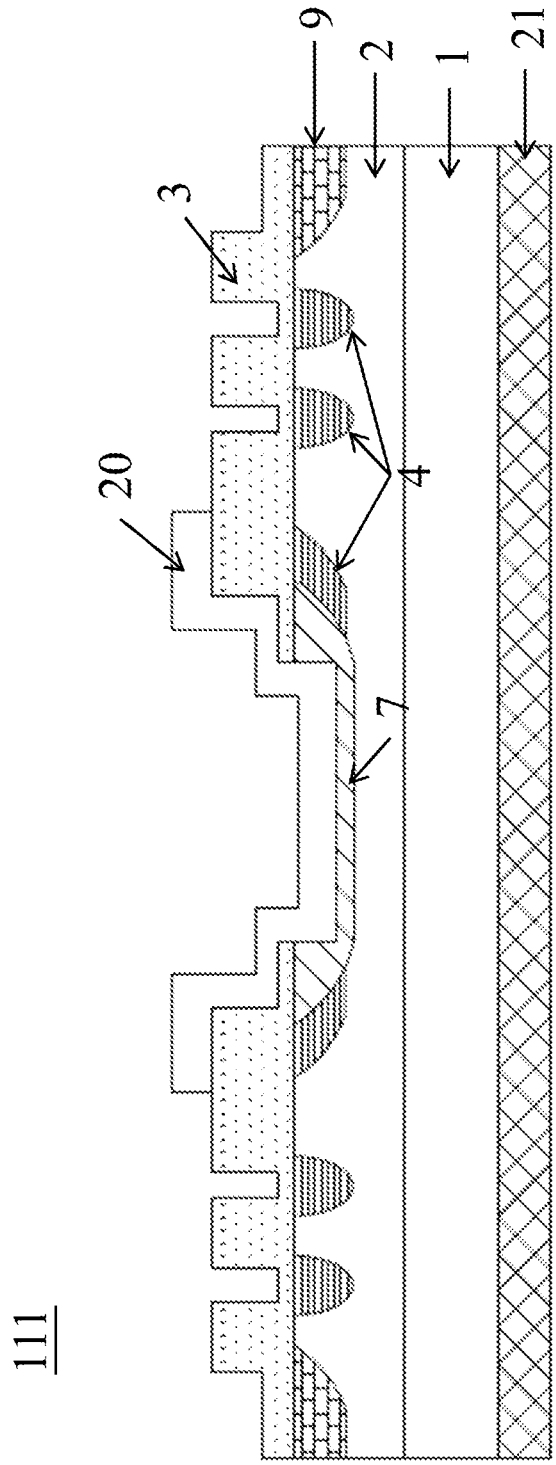
FIG. 11 shows a cross-sectional schematic diagram illustrating part of a fast recovery epitaxial diode (FRED) according to the eleventh embodiment of the invention.
Figure 12:
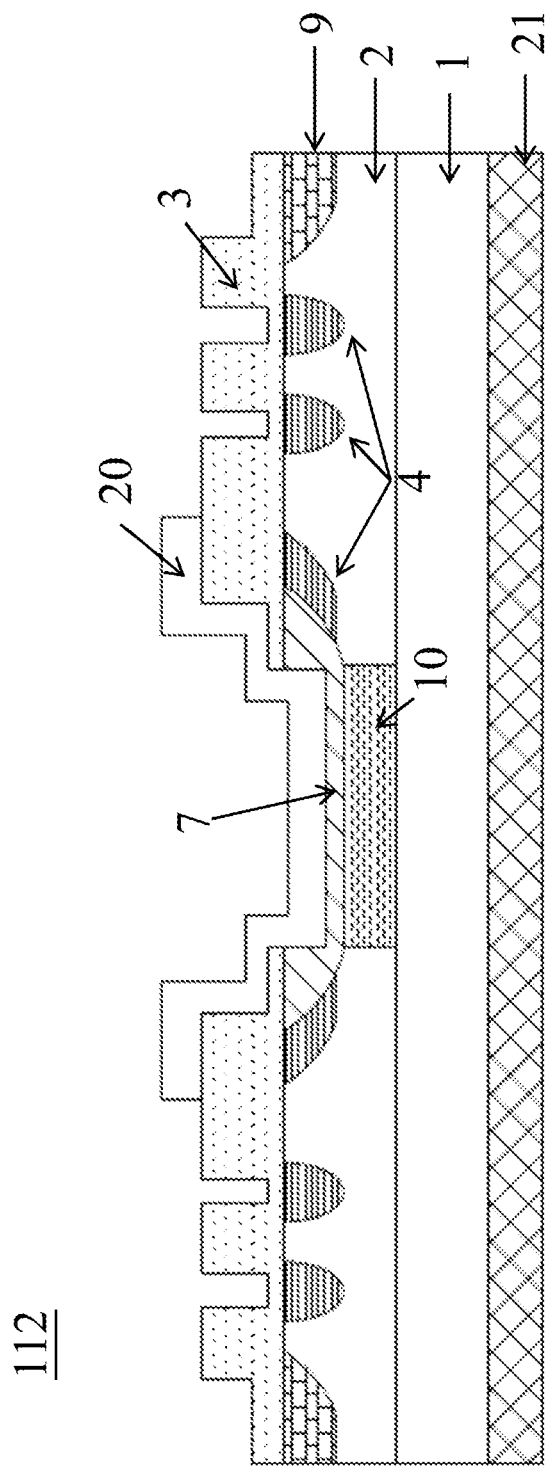
FIG. 12 shows a cross-sectional schematic diagram illustrating part of a fast recovery epitaxial diode (FRED) according to the twelfth embodiment of the invention.

FIG. 11 shows a cross-sectional schematic diagram illustrating part of a fast recovery epitaxial diode (FRED) (semiconductor device 111) according to the eleventh embodiment of the invention. The semiconductor device 111 comprises a type-I substrate 1 (n+), a type-I epitaxial layer 2 (n−), an oxide layer 3, a type-II doping region 4 (p−), an n region 9 (concentration larger than that of the n− region), a p+ region 7, a metal layer 20 and a metal layer 21. In another embodiment, FIG. 12 shows a cross-sectional schematic diagram illustrating part of a fast recovery epitaxial diode (FRED) (semiconductor device 112) according to the twelfth embodiment of the invention. The difference between the semiconductor device 112 and the semiconductor device 111 is that underneath the p+ region 7, an $N_{drift}$-channel is formed to further reduce the forward operating voltage ($V_F$).

Figure 13:
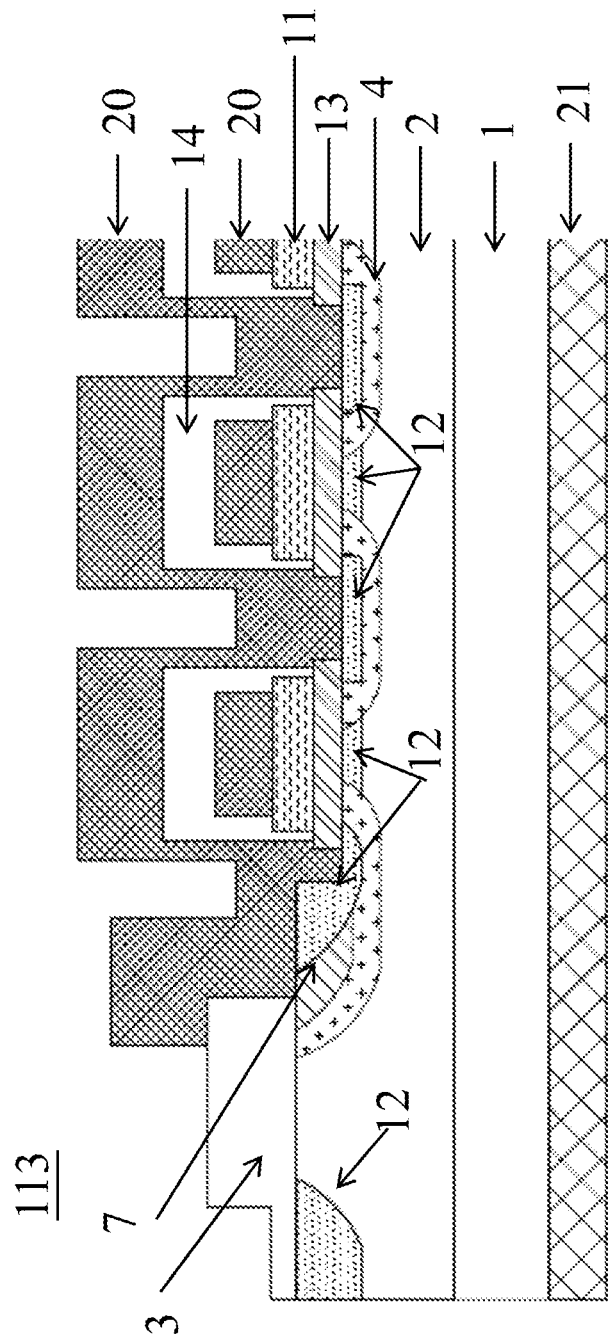
FIG. 13 shows a cross-sectional schematic diagram illustrating part of a MOS semiconductor device according to the thirteenth embodiment of the invention.
Figure 14:
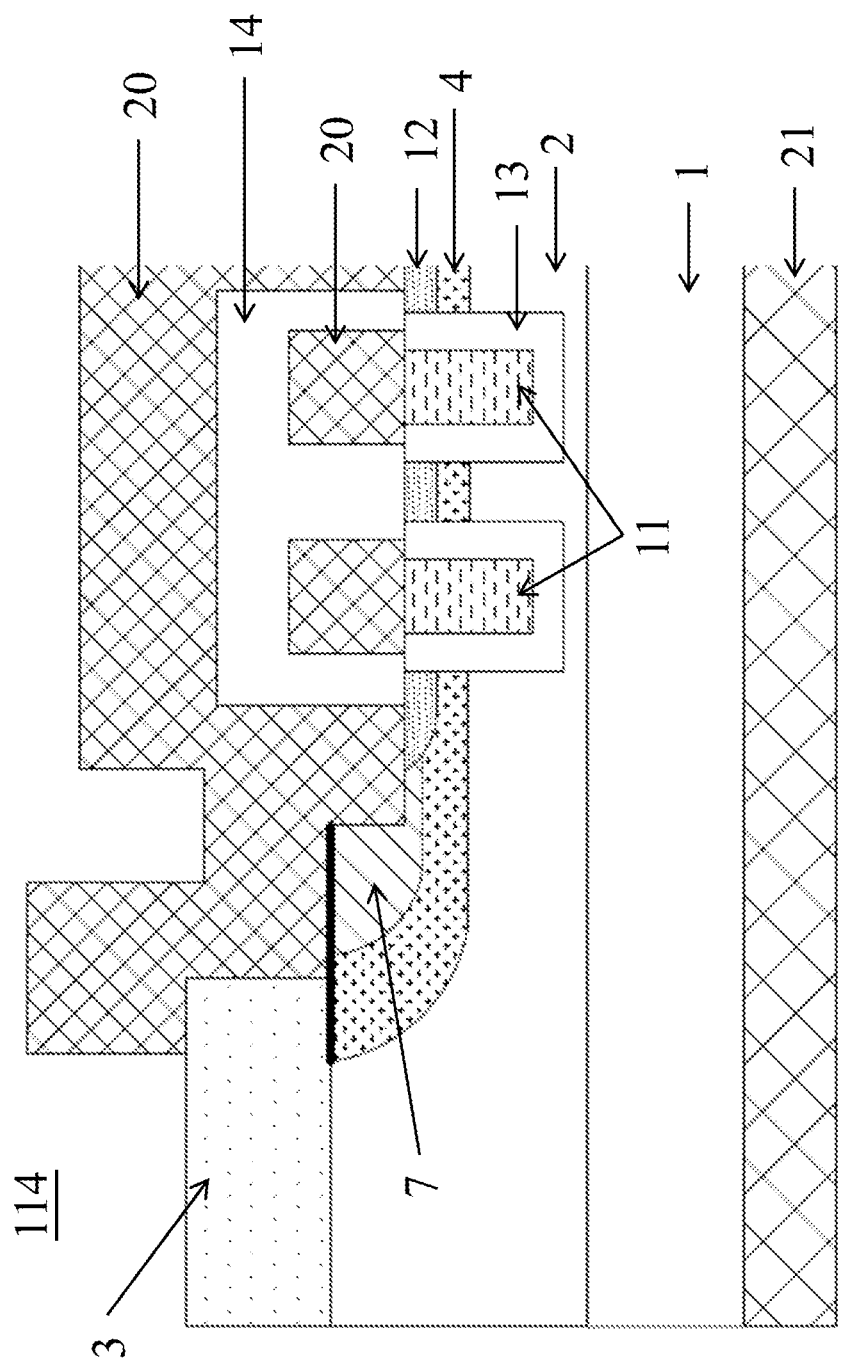
FIG. 14 shows a cross-sectional schematic diagram illustrating part of a MOS semiconductor device according to the fourteenth embodiment of the invention.
Figure 15:
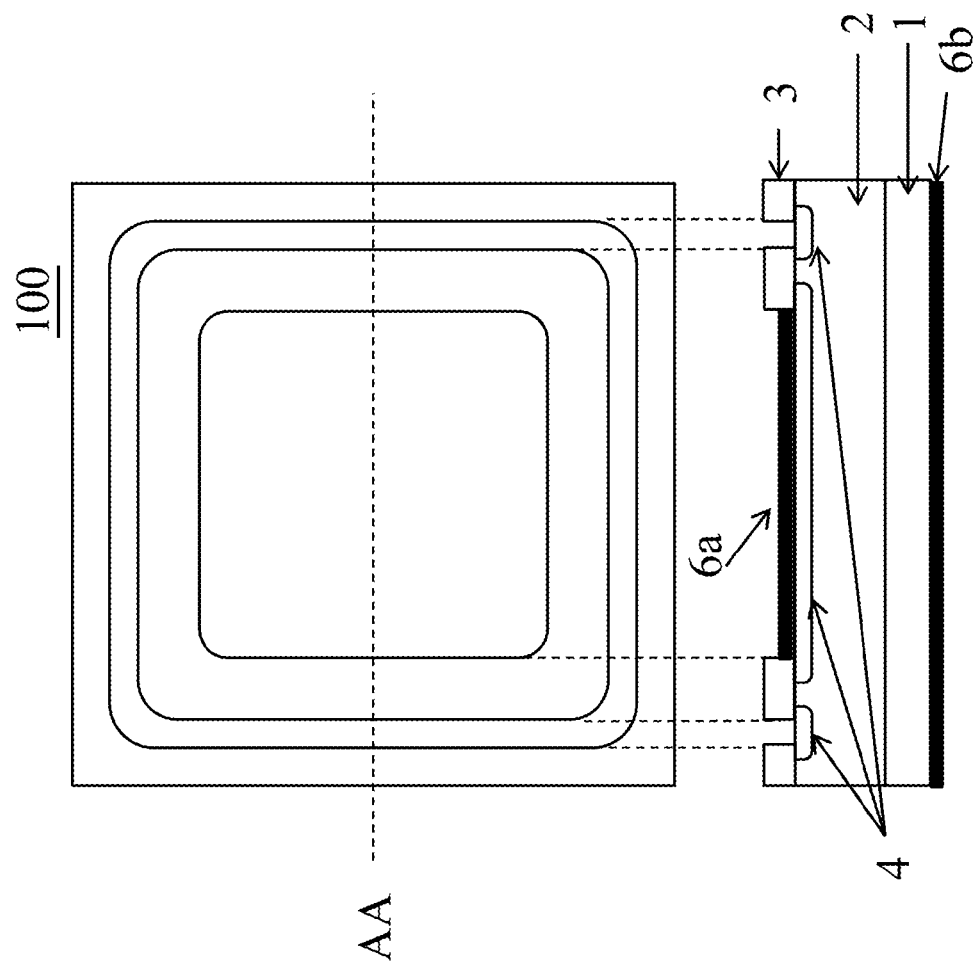
FIG. 15 shows a schematic diagram of a planar junction including a floating ring structure where the upper portion shows a top-view diagram and the lower portion shows a cross-sectional diagram according to prior art.

FIG. 13 shows a cross-sectional schematic diagram illustrating part of a MOS semiconductor device (semiconductor device 113) according to the thirteenth embodiment of the invention. The MOS semiconductor device (semiconductor device 113) is a planar type and comprises a type-I substrate 1 (n+), a type-I epitaxial layer 2 (n−), an oxide layer 3, a type-II doping region 4 (p−), an n region 12, a p+ region 7, a gate oxide layer 13, a poly-Si layer 11, an inter-metal dielectric layer 14, a metal layer 20 and a metal layer 21. In another embodiment, FIG. 14 shows a cross-sectional schematic diagram illustrating part of a MOS semiconductor device (semiconductor device 114) according to the fourteenth embodiment of the invention. The MOS semiconductor device (semiconductor device 114) is a trench type and comprises a type-I substrate 1 (n+), a type-I epitaxial layer 2 (n−), an oxide layer 3, a type-II doping region 4 (p−), an n region 12, a p+ region 7, a gate oxide layer 13, a poly-Si layer 11, an inter-metal dielectric layer 14, a metal layer 20 and a metal layer 21 where symbol 5 represents the mesa of the mesa-type junction termination extension structure.

The method for fabricating the above semiconductor devices 101~114 comprises the following steps:

Step S10: providing a type-I semiconductor substrate having a first surface and a second surface;

Step S20: forming a type-I epitaxial layer on the first surface;

Step S30: forming a junction termination extension structure in at least one region of the type-I epitaxial layer wherein the junction termination extension structure is of type-II doping;

Step S30: etching a central portion of the junction termination extension structure to form a depression functioning as an active region of the semiconductor device wherein the depression has a side surface and a bottom surface and, at the same time, to form a mesa-type junction termination extension structure at an outer portion of the junction termination extension structure surrounding the active region; and Step S40: forming at least one semiconductor component in the active region of the semiconductor device.

In one embodiment, the above method further comprises: forming a type-I or type-II doping region underneath the bottom surface of the depression by changing the doping concentration or doping type, after the step of etching the central portion of the junction termination extension structure to form the depression and the mesa-type junction termination extension structure (step S30).

In one embodiment, in the above method, the step S30 (the step of etching the central portion of the junction termination extension structure to form the depression and the mesa-type junction termination extension structure) comprises the following steps:

Step S32: forming a first junction termination extension structure in at least one region of the type-I epitaxial layer by using a first photo-mask and utilizing ion implantation and thermal diffusion methods;

Step S34: forming a second junction termination extension structure in one portion of the first junction termination extension structure by using a second photo-mask and utilizing ion implantation and thermal diffusion methods;

Step S36: forming a third junction termination extension structure in one portion of the second junction termination extension structure by using a third photo-mask and utilizing ion implantation and thermal diffusion methods.

In one embodiment, the first, second, and third junction termination extension structures separately are of type-II doping regions having different doping concentration.

In addition, the step S30, after the step of etching the central portion of the junction termination extension structure to form the depression, can further comprise the following step: forming a fourth junction termination extension structure in one portion of the second junction termination extension structure by using a fourth photo-mask and utilizing ion implantation and thermal diffusion methods.

Moreover, after the step of forming a fourth junction termination extension structure, the method further comprises the following step: forming a fifth junction termination extension structure in one portion of the fourth junction termination extension structure by using a fifth photo-mask and utilizing ion implantation and thermal diffusion methods.

In one embodiment, a dry etching or wet etching method is used to have the side surface slanted at an angle of 90~150° with respect to the bottom surface.

In one embodiment, alternately performing dry etching and wet etching is used to have the side surface be an arc surface.

In any of the above embodiments, any p-type semiconductor or doping and n-type semiconductor or doping can be switched to become n-type semiconductor or doping and p-type semiconductor or doping, respectively.

Example: fabricating the semiconductor device 107

Please refer to FIG. 7. A single-crystal n-type (type-I) substrate is used with resistivity $\rho=0.01$~$0.001$ Ω-cm and an n-type epitaxial layer ($\rho=20$~$30$ Ω-cm, thickness 50 μm~80 μm) is formed on the substrate. On the n-type epitaxial layer, $SiO_2$ (6000 Å) is grown. Then, coating a photo-resist layer, baking, exposure by a first photo-mask, and developing are performed to define junctions and component fabrication region. Ion-implantation windows are formed by etching $SiO_2$ and the p-type (type-II) ion-implantation (for example B11 with a dose of 5e15 (1/cm$^2$), energy 90 KeV) is carried out. Then, removing the photo-resist layer and high-temperature driving-in are performed together with growing $SiO_2$ (4000 Å) so as to obtain a junction depth Xjp about 9 μm and Rj about 0.8Xjp~0.9Xjp. The junction depth is defined as the junction of the same concentration of the two types.

A second photo-mask is used to fabricate the depression as the active region of the semiconductor device to form the mesa-type junction termination extension structure. The method to fabricate the depression, for example, is to coat a photo-resist layer, perform baking, exposure, developing and expose the depression and to form the mesa-type junction termination extension structure at the same time. The method to expose the depression can use for example dry or wet etching or both dry and wet etching to expose the region based on the photo-resist pattern. Finally, the residue of photo-resist or derivatives are removed and the semiconductor device 107 is thus obtained.

The above semiconductor component is selected from the group consisting of the following or combination thereof: Schottky diode, fast recovery epitaxial diode (FRED), metal oxide semiconductor (MOS), transistor, thin-film transistor, MOS field emission transistor, and insulated gate bipolar transistor (IBGT).

In conclusion, according to the semiconductor device with a junction termination extension structure on a mesa and the method for fabricating the same of the present invention, low forward operating voltages ($V_F$), high breakdown voltages, low leakage current and reduced current crowding effect can be achieved.

Although the present invention has been fully described by the above embodiments, the embodiments should not constitute the limitation of the scope of the invention. Various modifications or changes can be made by those who are skilled in the art without deviating from the spirit of the invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. A method of fabricating a semiconductor device with a junction termination extension structure on a mesa, the method comprising:
    providing a type-I semiconductor substrate having a first surface and a second surface;
    forming a type-I epitaxial layer on the first surface;
    forming a junction termination extension structure in at least one region of the type-I epitaxial layer wherein the junction termination extension structure is of type-II doping;
    etching a central portion of the junction termination extension structure to form a depression functioning as an active region of the semiconductor device wherein the depression has a side surface and a bottom surface and, at the same time, to form a mesa-type junction termination extension structure at an outer portion of the junction termination extension structure surrounding the active region;
    forming a type-I or type-II doping region underneath the bottom surface of the depression; and
    forming at least one semiconductor component in the active region of the semiconductor device;
    wherein "type-I" is defined as either n-type or p-type semiconductor or doping and "type-II" is then defined as one type of semiconductor or doping different from "type-I".

2. The method according to claim 1, further comprising: forming a guard ring region or guard ring regions in the type-I epitaxial layer at the same time when the step of forming a junction termination extension structure in at least one region of the type-I epitaxial layer is performed.

3. The method according to claim 1, wherein the step of forming a junction termination extension structure in at least one region of the type-I epitaxial layer comprises:
    forming a first junction termination extension structure in at least one region of the type-I epitaxial layer by using a first photo-mask and utilizing ion implantation and thermal diffusion methods; and
    forming a second junction termination extension structure in one portion of the first junction termination extension structure by using a second photo-mask and utilizing ion implantation and thermal diffusion methods.

4. The method according to claim 1, wherein the mesa-type junction termination extension structure has a depth, in a thickness direction of the semiconductor device, being larger than or equal to a mesa height that is a distance between the bottom surface of the depression and the mesa of the mesa-type junction termination extension structure.

5. The method according to claim 1, wherein a dry etching or wet etching method is used to have the side surface slanted at an angle of 90 ~150° with respect to the bottom surface.

6. The method according to claim 1, wherein alternately performing dry etching and wet etching is used to have the side surface be an arc surface.

7. The method according to claim 1, wherein the semiconductor component is selected from the group consisting of the following or combination thereof: Schottky diode, fast recovery epitaxial diode (FRED), metal oxide semiconductor (MOS), transistor, thin-film transistor, MOS field emission transistor, and insulated gate bipolar transistor (IBGT).

8. The method according to claim 3, wherein the step of forming a junction termination extension structure in at least one region of the type-I epitaxial layer further comprises:
    forming a third junction termination extension structure in one portion of the second junction termination extension structure by using a third photo-mask and utilizing ion implantation and thermal diffusion methods.

9. The method according to claim 3, after the step of etching the central portion of the junction termination extension structure to form the depression and the mesa-type junction termination extension structure, further comprising:
    forming a fourth junction termination extension structure in one portion of the second junction termination extension structure by using a fourth photo-mask and utilizing ion implantation and thermal diffusion methods.

10. The method according to claim 8, wherein the first, second, and third junction termination extension structures separately are of type-II doping regions having different doping concentration.

11. The method according to claim 9, further comprising:
forming a fifth junction termination extension structure in one portion of the fourth junction termination extension structure by using a fifth photo-mask and utilizing ion implantation and thermal diffusion methods, after the step of forming a fourth junction termination extension structure.

* * * * *